(12) United States Patent
Wiegand

(10) Patent No.: US 10,788,335 B2
(45) Date of Patent: Sep. 29, 2020

(54) POSITION SENSING SYSTEM

(71) Applicant: Rolls-Royce Corporation, Indianapolis, IN (US)

(72) Inventor: Kerry Wiegand, Brownsburg, IN (US)

(73) Assignee: Rolls-Royce Corporation, Indianapolis, IN (US)

(*) Notice: Subject to any disclaimer, the term of this patent is extended or adjusted under 35 U.S.C. 154(b) by 401 days.

(21) Appl. No.: 15/660,898

(22) Filed: Jul. 26, 2017

(65) Prior Publication Data

US 2019/0033095 A1 Jan. 31, 2019

(51) Int. Cl.
*G01D 5/14* (2006.01)
*G01D 5/244* (2006.01)
*H03M 1/48* (2006.01)

(52) U.S. Cl.
CPC .......... *G01D 5/14* (2013.01); *G01D 5/24466* (2013.01); *G01D 5/24476* (2013.01); *H03M 1/485* (2013.01)

(58) Field of Classification Search
CPC .......... G01D 5/24466; G01D 5/24476; H03M 1/485
See application file for complete search history.

(56) References Cited

U.S. PATENT DOCUMENTS

| | | | |
|---|---|---|---|
| 3,553,647 A * | 1/1971 | Bullock | H03M 1/00 340/870.05 |
| 3,566,397 A | 2/1971 | Walton | |
| 4,687,952 A | 8/1987 | Capizzi, Jr. | |
| 4,797,827 A | 1/1989 | Cockerham | |
| 5,084,696 A | 1/1992 | Guscott et al. | |
| 5,477,142 A | 12/1995 | Good et al. | |
| 8,089,270 B2 | 1/2012 | Sheller | |

(Continued)

FOREIGN PATENT DOCUMENTS

EP 2 657 709 A2 10/2013
EP 2 657 709 A3 1/2014

(Continued)

OTHER PUBLICATIONS

Intersil™, The Integrating A/D Converter (ICL7135), Application Note, Feb. 1999, AN017, pp. 1-5.

(Continued)

*Primary Examiner* — Elias Desta
(74) *Attorney, Agent, or Firm* — Brinks Gilson & Lione

(57) ABSTRACT

A position sensing system for a rotating object may include analog conditioning circuitry, analog to digital converter circuitry, and a controller. The analog conditioning circuitry may identify a half cycle of an analog input signal received from a sensor, which has a variable period and a variable magnitude. The analog to digital converter circuitry may process the input signal during the variable period. The controller may control the analog to digital converter circuitry to compare a magnitude of the identified half cycle of a first variable period of the input signal to a magnitude of the identified half cycle of a second variable period of the input signal. The controller may generate an output signal when a difference between the magnitude of the identified half cycle of the first variable period and the magnitude of the identified half cycle of the second variable period is greater than a predetermined threshold.

19 Claims, 7 Drawing Sheets

(56) References Cited

U.S. PATENT DOCUMENTS

| | | |
|---|---|---|
| 9,285,244 B2 | 3/2016 | Pigott et al. |
| 2011/0084937 A1* | 4/2011 | Chang .................. G06F 3/0416 345/174 |
| 2015/0061656 A1 | 3/2015 | Fernandez et al. |

FOREIGN PATENT DOCUMENTS

| | | |
|---|---|---|
| EP | 2 916 108 A1 | 9/2015 |
| JP | 2012058165 A2 | 3/2012 |

OTHER PUBLICATIONS

"Tutorial 1041—Understanding Integrating ADCs", Maxim, pp. 1-5., May 2, 2002, https://www.maximintegrated.com/en/app-notes/index.mvp/id/1041.

Extended European Search Report, dated Jan. 4, 2019, pp. 1-37, issued in European Patent Application No. 18181312.2, European Patent Office, Munich, Germany.

European Office Action dated Jun. 3, 2020, pp. 1-4, issued in European Patent Application No. 18181312.2, European Patent Office, Munich, Germany.

* cited by examiner

POSITION SENSING SYSTEM

TECHNICAL FIELD

This disclosure relates to position sensing and, in particular, to a position sensing system capable of sensing position of a rotating object at high revolution per minute.

BACKGROUND

Measure of angular position of a rotating shaft can be accomplished in many ways. With engines, and other high speed devices, accuracy of measurement of shaft position can be challenging. Timing of measurement and sampling frequency can be important considerations that may constrain accuracy and repeatability, as well as impact data quantity and levels of data analysis resources. Further, processing delay and noise in the measurement process may compromise reliability and accuracy. A precise, accurate, efficient and timely way to detect position is needed.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

By way of an introductory example a position sensing system may receive a series of variable magnitude and variable period input signal pulses forming an analog input signal. The system may average a voltage of a first input signal pulse over a half cycle of a first variable period and time a ramp time of a magnitude of the voltage of the first input signal pulse to a predetermined voltage magnitude to obtain a first ramp time. The system may also average a voltage of a second input signal pulse over a half cycle of a second variable period, and time a ramp time of a magnitude of the voltage of the second input signal pulse to the predetermined voltage magnitude to obtain a second ramp time. Based on comparison of the first ramp time and the second ramp time, the system may trigger an output pulse when a difference between the first ramp time and the second ramp time is outside a predetermined range.

The system may include analog to digital converter circuitry and a controller. The controller may control the analog to digital converter circuitry to iteratively average a magnitude of the analog input signal during identified half cycles of the analog input signal. In addition, the controller may compare a time ramp of the iteratively averaged magnitude of the first identified half cycle of the first variable period of the input signal to a time ramp of the iteratively averaged magnitude of the second identified half cycle of the second variable period of the input signal to identify the difference between the magnitude of the identified half cycle of the first variable period of the analog input signal and the magnitude of the identified half cycle of the second variable period of the analog input signal.

An interesting feature of the position sensing system may be that the system includes an analog conditioning circuit configured to identify a half cycle of the analog input signal. The analog conditioning circuit includes a programmable attenuator configured with a plurality of predetermined attenuation circuits, and the controller is configured to select one of the predetermined attenuation circuits based on an amplitude of at least one of the magnitude of the identified half cycle of the first variable period of the analog input signal or the magnitude of the identified half cycle of the second variable period of the analog input signal.

Figure 1:
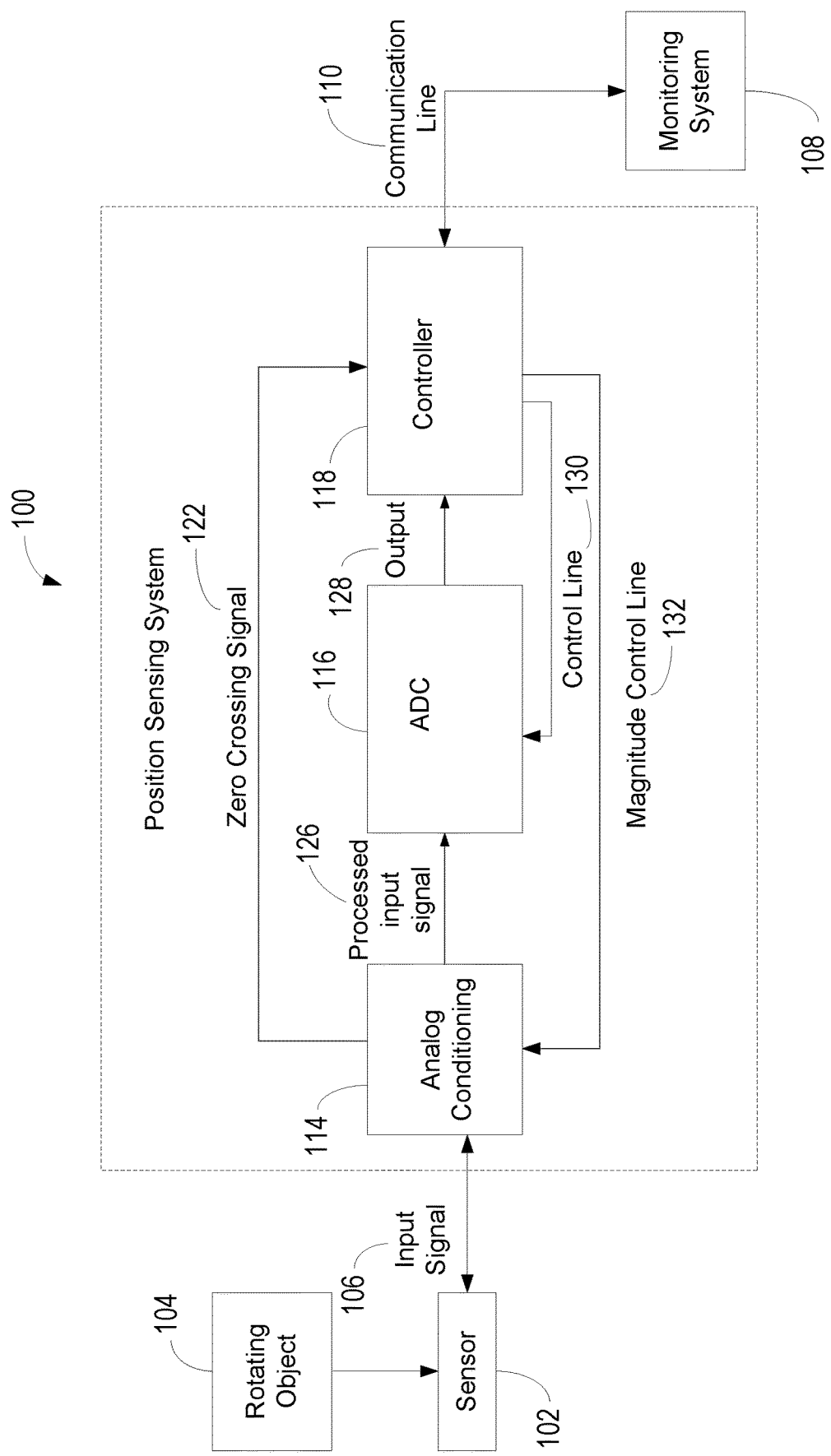
FIG. 1 is a block diagram of a position sensing system.

FIG. 1 illustrates an example block diagram of a position sensing system 100. The position sensing system 100 may be in communication with a sensor 102 that includes circuitry capable of sensing a rotating object 104 and providing a sensor input signal 106 to the system 100. Other types of communication, such as other monitoring signals and/or control signals may also be communicated between the sensor and the system 100. In addition, the position sensing system 100 may be in communication with monitoring system 108. The position sensing system 100 may perform bi-directional communication with the monitoring system 108 regarding control signals and/or data, over a communication line 110.

In an example application, the rotating object 104 may be wheel or shaft included in an engine, such as a gas turbine engine that rotates at high speed such as 2,000 to 10,000 revolutions-per-minute (RPM), and the monitoring system 108 may be a control system for the engine. In other examples the rotating object 104 may be a standalone rotating object or included in a lager device or mechanism, and the monitoring system may be any form of computing or monitoring system.

The sensor 102 may be any form of sensing device or system with circuitry capable of sensing a moving object and outputting an analog sensor signal indicative of the moving object having a variable magnitude and a variable period. The variable magnitude of the sensor signal may vary between a positive voltage and a negative voltage such that the sensor signal performs a zero crossing between negative and positive at least once during each variable period. Thus, the sensor signal may include a first cycle, such as a first half cycle, with a positive voltage and a second cycle, or second half cycle, with a negative voltage. The variable period may represent a varying time period in which the sensor signal completes a repetitive pattern.

In an example, the sensor 102 may output a sensor signal in a substantially sinusoidal waveform, where the waveform has a positive and a negative portion of the wave form in each variable period, which may or may not be symmetrical about the zero crossing, and may or may include equal and opposite portions within the variable period. In an example, the sensor 102 may be a transducer, and the rotating object 104 may include features that variably become proximate the sensor 102 such that sensor 102 provides a signal indicative of proximity. In this example, the shape and form of the sensor signal 106 may depend on various operational and/or physical parameters, such as the relational position of the sensor 102 with respect to the features on the rotating object 104, the speed of rotation of the object 104, the configuration of the sensor 102 and or the object 104, and any other parameters affecting proximity measurement of the features by the sensor 102 and transmission of the sensor input signal 106 to the position sensing system 100.

The position sensing system 100 may include an analog conditioning circuitry 114, analog-to-digital converter (ADC) circuitry 116, and a controller 118. The analog conditioning circuitry 114 may receive and may condition a series of variable magnitude and variable period input signal pulses received as the input signal 106 from the sensor 102. For example, the analog conditioning circuitry 114 may identify a half cycle of the input signal 106 received from the sensor 102 and generate and output a zero crossing signal 122 to the controller 118. Identification of the half cycle may be, indicative of a zero voltage crossing of the input signal 106 between a positive magnitude of voltage and a negative magnitude of voltage during the variable period. In another example, the analog conditioning circuitry 114 may be used to dynamically attenuate the input signal 106. In still another example, the analog conditioning circuitry may filter the input signal 106.

The ADC circuitry 114 may receive a processed analog input signal 126 from the analog conditioning circuitry 114. In examples where the analog conditioning circuitry 114 conditions the input signal 106, the ADC circuitry 116 may receive a conditioned processed analog input signal 126, however, in other examples, the ADC circuitry 116 may receive the processed analog input signal 126 without conditioning. The ADC circuitry 114 may be controlled by the controller 118.

The controller 118 may include any device capable of performing digital logic, such as one or more field programmable gate arrays (FPGA), processors, or any other form of device capable of performing the functionality described herein. The controller 118 may also include memory capable of storing instructions and data. The ADC circuitry 116 may output signals and data to the controller 118 on an output line 128. In addition, the controller 118 may control operation of the ADC circuitry 116 via a control line 130.

Control of the ADC circuitry 116 may include controlling the ADC circuitry to compare a magnitude of an identified half cycle of the input signal 126 during a first variable period of the input signal 126 to a magnitude of an identified half cycle during a second variable period of the input signal 126. The controller 118 may generate an output signal (an annunciate signal) on the communication line 110 indicating when the difference between the magnitude of the identified half cycle of the input signal 126 during the first variable period and the magnitude of the identified half cycle during the second variable period is greater than a predetermined threshold. For example, the controller 118 may control the ADC circuitry 116 to receive as the input signal 126 a series of variable magnitude and variable period input signal pulses. The ADC circuitry 116 may be controlled by the controller 118 to average a voltage of a first input signal pulse over a half cycle of a first variable period and a voltage of a second input pulse signal over a half cycle of a second variable period. The controller 118 may time a ramp time of a magnitude of the voltage of each of the first and second input pulse signals to obtain respective first and second ramp times. The first and second ramp times may be compared by the controller 118, and the controller 118 may generate an output pulse (annunciate signal) on the communication line 110 indicating when the difference between the first and second ramp times are outside a predetermined range.

In an example, the controller 118 may also control the analog conditioning circuitry 114 to manage the magnitude of the sensor input signal 106 via a magnitude control line 132. The controller 118 may monitor the magnitude of the input pulses, and automatically and dynamically adjusting a gain of the input signal to maintain the variable magnitude in a predetermined voltage range.

Figure 2:
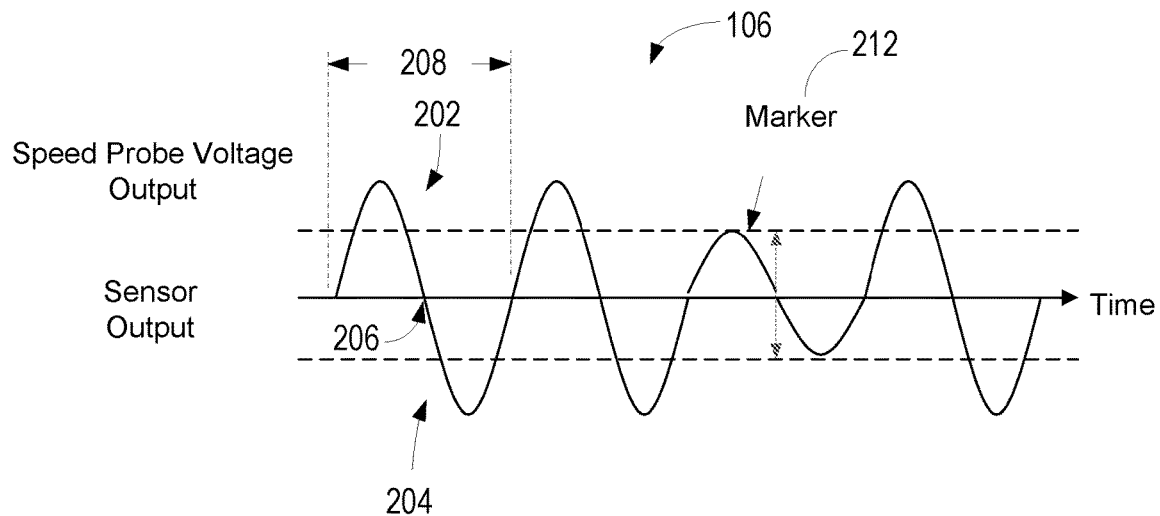
FIG. 2 is an example waveform of a sensor input signal.

FIG. 2 is an example waveform of a sensor input signal 106. In the example of FIG. 2, the waveform is generated with a sensor, such as a proximity sensor, that generates the sensor input signal 106 based on sensing a phonic wheel having a plurality of teeth. In this example, the teeth on the wheel are all of uniform height except one tooth on the wheel, which is shorter than the nominal height of all the other teeth. The sensor (102—FIG. 1) may be positioned proximate the teeth so as to detect each tooth as it passes. In an example, the sensor may be a variable reluctance sensor, and there may be 30-60 teeth on the wheel, each of which may include a ferrous material, such that a magnetic flux of a magnetic material and corresponding current in a coil included in the sensor varies with each passing tooth so as to reach a maximum when a respective tooth is in closest proximity to the sensor. In other examples, other configurations of teeth and sensors are possible.

In the example waveform of FIG. 2, a series of substantially sinusoidal waveforms are illustrated. The shape of the waveforms are defined as substantially sinusoidal since they include a positive portion 202, a negative portion 204, and zero crossing 206 once per period 208. The actual shape of the substantially sinusoidal waveforms may vary based on variable parameters such as hardware parameters like the positioning/proximity of the sensor with respect to the object, the type of proximity sensor used, the shape and configuration of the teeth, and the like, as well as operational parameters like the speed of rotation of the object, noise/interference levels, temperature, and the like. Thus, the shape of the waveforms is not limited to sinusoidal and the substantially sinusoidal waveform may be any shape of waveform having a positive portion 202, a negative portion 204, and zero crossing 206 once per period 208.

During operation, the period 208 may be a variable period, or frequency, based on variation in the speed of rotation of the object. In addition, the magnitude of the voltage of the input signal may be variable based on the speed of the object. In applications where the speed of rotation of the object varies significantly, such as from some 0 to 20,000 RPM, the magnitude of the voltage, or amplitude of the signal can also vary significantly. In the illustrated example, each of teeth passing the sensor during a revolution of the object is represented by a variable period, such that the teeth that are of uniform height have a substantially similar variable period and substantially similar variable voltage. The one tooth on the wheel that is shorter than the nominal height of the remaining teeth provides a corresponding shorter waveform. Thus, the system is capable of extracting a marker from the substantially sinusoidal signal illustrated in FIG. 2 by detecting the short tooth as a marker 212, such as once-per-revolution (OPR) marker, due to the reduced amplitude per revolution of the object.

Figure 3:
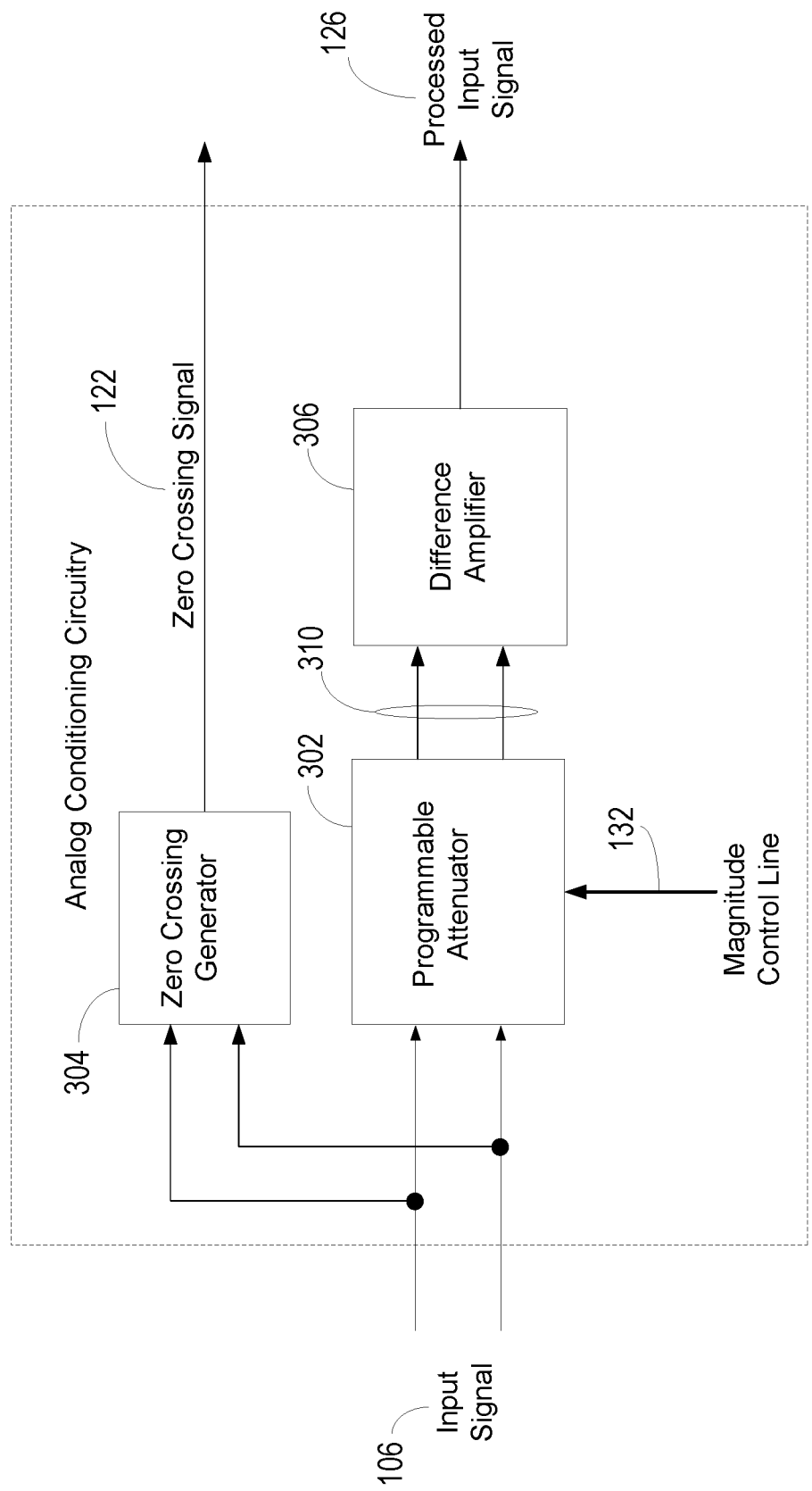
FIG. 3 is a block diagram of an example of analog conditioning circuitry included in the position sensing system.

FIG. 3 is a block diagram of an example of the analog conditioning circuitry 114 included in the position sensing system. The analog conditioning circuitry 114 may include programmable attenuator circuitry 302, difference amplifier circuitry 304 and zero crossing generator circuitry 306. The sensor input signal 106 may be received by the programmable attenuator 302 and the zero crossing pulse generator 304 input circuitry. In this example, the input signal 106 may be a differential input signal received from a sensor such as a differential speed probe, which is converted to a single-ended signal to form the processed input signal 126. In other examples, the input signal 106 may be a single ended signal and conversion from a differential input signal may be omitted.

The programmable attenuator circuitry 302 may the attenuate the input signal 106 to maintain the peak-to-peak voltage in a predetermined range. For example, due to the speed of the rotating object, and the number of teeth detected, the peak-to-peak voltage may vary from the 400 mV to 220V peak-to-peak. In this example, the programmable attenuator circuitry 302 may be dynamically step changed as the peak-to-peak input voltage changes to maintain the peak-to-peak voltage provided as the processed input signal 126 in a range of, for example, 1 to 5 volts peak-to-peak. In other examples, any other range of voltage may be used, which maintains the peak-to-peak voltage amplitude above a minimum threshold above the noise floor to maintain accuracy of the measurements, and below a high threshold to avoid signal clipping and/or saturation.

Control of the dynamically adjustable attenuation of the programmable attenuator circuitry 302 may be performed by the controller 118 using attenuation commands transmitted over the magnitude control line 132. In an example configuration, the programmable attenuator circuitry 302 may be a multiplexor containing a plurality of predetermined attenuation circuits, such as different resistor legs, configured in parallel to provide dynamic step changes between a plurality of ratios, such as 4:1, 8:1, 16:1, or 32:1 as directed by the controller 118. Thus, based on an amplitude of the input signal 106, the controller may dynamically select one of the attenuation circuits, and dynamically select others of the attenuation circuits as the amplitude changes. Accordingly, half cycles of the variable magnitude of the voltage during each variable period of the input signal 106 may be dynamically attenuated by the same or different attenuation circuits.

The difference amplifier circuitry 304 receives the input signal 106 following attenuation (if any) by the programmable attenuator 302, and may convert the differential input signal 310 to a single-ended input signal as part of the conditioning being performed to generate the processed input signal 126. Thus, the difference amplifier circuitry 304 may be omitted where there is no conversion of the input signal 106.

The zero crossing generator circuitry 306 may generate a zero crossing signal on the zero crossing signal line 122 each time the input signal crosses zero volts. In other examples, the zero crossing may be a predetermined voltage other than zero volts. Due to the cyclic nature of the input signal crossing zero voltage once each variable period, the zero crossing signal may be a series of pulses where each pulse represents a zero crossing to digital logic of the controller. The zero crossing generator circuitry 304 may also filter the zero crossing signal to reduce the impact of noise on the pulse train being generated.

Referring to FIGS. 1-3, in an example implementation, the position sensing circuit 100 may detect when the marker 212, such as a short tooth on a phonic wheel, passes the sensor 102. The marker 212 may be used to determine the position of a rotating object 104, such as a shaft, as it rotates. The position sensing circuit 100 minimizes any phase shift of the input signal 106 for the frequency range of interest in order to accurately match the shaft position with other data being collected by, for example, the monitoring system 108. The position sensing circuit 100 may detect the marker 212 by comparing the amplitude of the current positive half period with another positive half period sequentially positioned in the variable magnitude and variable amplitude input signal 106. If a difference detected between current positive half period amplitude when compared to another positive half period amplitude exceeds a predetermined threshold, such as a programmed % threshold, then the position sensing circuit 100 may generate an output signal (annunciate signal), or otherwise assert a detection flag.

The position sensing circuit 100 may be a mixture of analog and digital functions to avoid having to use a high sample rate analog-to-digital converter in a fully software based solution to reliably detect the occurrence of a short tooth at high operating frequencies of the speed signal. In addition, the position sensing circuit 100 foregoes the need for software processing of a high number of samples using a large percentage of available processing time of a central processing unit to detect the occurrence of a short tooth. Further, the position sensing circuit 100 avoids the memory storage requirements associated with storage of sample generated for a high sample rate analog-digital-converter operating with a fixed sample rate high enough to reliable sample at high operating frequencies of the speed signal. In an example implementation, the analog functions may include a high pass filter, a buffer, and a dual slope integrator, along with zero crossing and threshold comparator circuits. The digital functions of the position sensing circuit 100 may control the operation of dual slope integrator, measure the amplitude of the input signal 106 (via the dual slope integrator), and compare the current measured input amplitude to previous input signal amplitude to detect a short tooth passing. In other example implementations, variations are possible which still minimize phase delay, while reliably and efficiently detecting a short tooth with minimized data storage and processing time.

Figure 4:
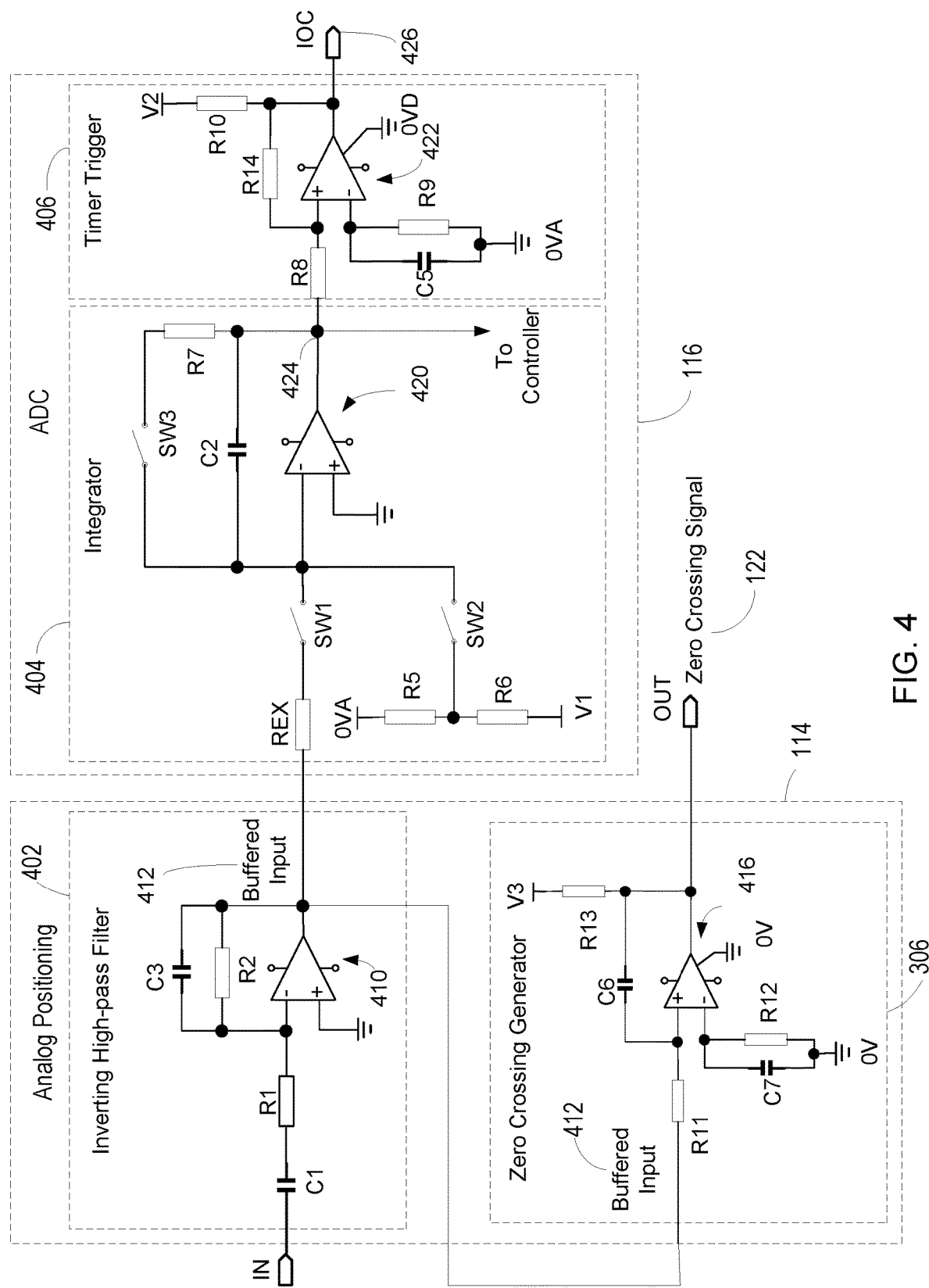
FIG. 4 is a circuit diagram illustrating an example of zero crossing generator circuitry and filter circuitry included in position sensing system.

FIG. 4 is a circuit diagram that includes an example of the zero crossing generator circuitry 306 and filter circuitry 402. The zero crossing generator circuitry 306 and the filter circuitry 402 may be included in the analog conditioning circuitry 114. FIG. 4 also includes an example of the ADC circuitry 116. The ADC circuitry may include an integrator circuit 404 and a timer trigger circuit 406.

In this example, the filter circuit 402 may be in the form of a high pass inverting circuit that includes a first capacitor (C1), a second capacitor (C3), a first resistor (R1), a second resistor (R2), and a buffer 410. In an example implementation, the high pass filter included in the filter circuit 402 may include an RC network consisting of capacitor C1, such as a 1 μF capacitor, and resistor R1, such as a 100 kΩ resistor. The cutoff frequency may be at a predetermined frequency, such as 1.6 Hz, so as to be below the lowest operational frequency. In an example, the predetermined frequency may be more than two decades below the lowest operational frequency, such as two decades below 350 Hz so as to minimize any phase shift introduced by the filter circuit 402 at operating frequencies. The buffer 410 may provide a low output impedance for the filter circuit 402. The capacitor (C3), such as a 33 pF capacitor may be placed in parallel with the feedback resistor R2 to compensate for the RC low-pass network formed by the feedback resistor R2 and the parasitic capacitance on the inverting input pin of the buffer 410. The filter circuitry 402 may effectively eliminate any direct current (DC) component included in the input signal. In one example, the 3 dB point of the filter circuitry 402 is about 10 Hz, and the lowest variable frequency of the input signal is about 134 Hz. The filter circuitry 402 may output a buffered input signal 412, which may be received by the zero crossing generator circuit 306.

The zero crossing generator circuitry 306 may include a first resistor (R11), a second resistor R12, a third resistor R13, a first capacitor (C6), a second capacitor (C7), and a comparator 416. The comparator 416 may be used to signal the zero crossing of the buffered input signal 412 received from the filter circuit 402. The zero crossing signal 122 may an output to the controller so that the controller can control the ADC circuitry 116. More specifically, the controller may control switches included in the ADC circuitry 116 thru different phases of a signal amplitude measurement/comparison operation using the zero crossing signal 122. In order to introduce as little phase shift as possible (limited by an offset voltage (v3) of the zero crossing generator circuitry 306), a hysteresis feedback resistor may omitted. Instead a dynamic hysteresis capacitor in the form of capacitor (C6) may be inserted across an output of the comparator 416 and a positive input terminal of the comparator 404. This capacitor (C6) may provide two effects: first operation of the capacitor (C6) may reduce the number of output changes around the zero crossing by pulling the input terminal up or down during the transition (this offset discharges thru the input resistor R13). Second, the capacitor (C6) may form a low-pass filter with the input resistor R13 when an output of the comparator 416 is low (connected to ground), which may result in filtering higher out of band frequencies from the input signal 106. The buffered input signal 412 may be provided as the processed input signal 126 (FIG. 1) to the integrator 404 included in the ADC circuitry 116.

The integrator 404 may average the input waveform over a half cycle of each variable period of the input signal by integration of the voltage magnitude of the input signal during the half cycle. A time duration of the integration may be controlled by the controller based on the discrete signal from the zero-crossing generator circuitry 306. To minimize phase variance, filtering at the zero-crossing generator circuitry 306 may be kept to a minimum and only a/c hysteresis via a feedback capacitor (C6) may be employed in order to minimize high-frequency switching of the comparator 416 when the input signal is close to a zero voltage crossing.

The integrator 404 may be formed from the circuit combination of a first resistor (REX), a second resistor (R5), a third resistor (R6), a fourth resistor (R7) a first switch (SW1), a second switch (SW2), a third switch (SW3), a capacitor (C2) and a comparator 420. The switches (SW1, SW2, SW3), such as 4 element single pole, single throw switches, may be controlled by the controller. Operation of the integrator 404 may integrate over a half period of each variable period of the input signal. Values for resistor (REX) and capacitor (C4) may be designed in order to avoid clipping the output of the integrator 404 based on a predetermined maximum input voltage for a given frequency. The effect of harmonic distortion on the integration result may be minimized due integration over a half period of each variable period, which will resolve harmonics having an amplitude low enough not to cause the integrator output to clip, however, odd harmonics, such as $3^{rd}$ order harmonics, by appropriate sizing of the resistor REX based on a predetermined cap of the fundamental amplitude, such as 15%.

The input signal voltage may be maintained by the programmable attenuator (302 FIG. 3) within the capabilities of the comparator 420. Thus, the gain of the integrator 404 may be set to a minimum level, such that the programmable attenuator is not directed by the controller to switch in too high of a peak-to-peak voltage magnitude of the input signal provided to the ADC circuitry. The integrator gain may be set based on resistor REX. Accordingly, the value of resistance of resistor REX may be set so that an output of the integrator 404 at the end of a half cycle in any given variable period is greater than the upper voltage switch limit at a maximum frequency for a given maximum input capability. Thus, in example configurations, application of a maximum input voltage in the input signal to the position sensing system may result in the attenuation being increased.

The switches (SW1, SW2, SW3) may be individually controlled by the controller to independently close at predetermined times to correspond to each of phase of operation of the integrator 404. In the example illustrated in FIG. 4, the phases of operation includes a first phase during which the input signal is averaged over a time period of a half cycle by integration of the input signal to a magnitude of voltage for the variable period, a second phase during which the magnitude of voltage derived by integration in the first phase is ramped by discharging the magnitude of voltage to reach a predetermined fixed voltage; and a third phase during which the circuitry is reset in preparation to again begin phase 1.

The timer trigger 406 includes a first resistor (R8), a second resistor (R10), a third resistor (R14), a fourth resistor (R9), a capacitor (C5) and a comparator 422. The timer trigger 406 may be used to signal the crossing of an integrator output 424 of the integrator 404 thru zero crossing during (end of phase 2). A 100 k resistor across the output and non-inverting input pins provides hysteresis while still keeping the positive going zero-crossing point near zero volts In the example of FIG. 4, during the first phase (phase 1) switch SW1 is closed and first half cycle of the input signal charges the integrating capacitor (C2). Upon the negative going zero crossing of the input signal, the integrator 404 enters phase 2 by the switch (SW1) opening to disconnect the input signal waveform from the comparator 420, and the switch (SW2) connecting a fixed voltage (V1) in series with resistor (R6) to discharge the integrating capacitor (C2) at a fixed slope. The ramp time it takes to discharge the voltage across the integrating capacitor (C2) is timed by the controller (which also controls the operation of the switches). The comparator 422 of the timer bigger circuitry 406 may be used to signal when the integrator output 424 crosses a predetermined threshold while discharging toward the fixed voltage (V1). Signaling to the controller that the integrator output 424 crosses a predetermined threshold may be in the form of an integration output crossing (100) signal 426 generated by the timer trigger circuitry 406.

In the example of FIG. 4, the fixed voltage V1 is a negative voltage, and the predetermined threshold is a zero volt threshold. The integrator 404 is then held in reset by the controller opening the switch (SW2) and closing the switch (SW3) until the next variable period commences. The controller may open the switch (SW2) and close the switch (SW3) to being phase 3 when the integrated output signal 424 crosses the predetermined threshold, such as zero volts as indicated by the timer trigger 406. The integrator 404 may be held in reset (phase 3) by switch (SW3) connecting resistor (R7), such as a 100 ohm resistor across the integrating capacitor (C3) until the next variable period starts.

Figure 5:
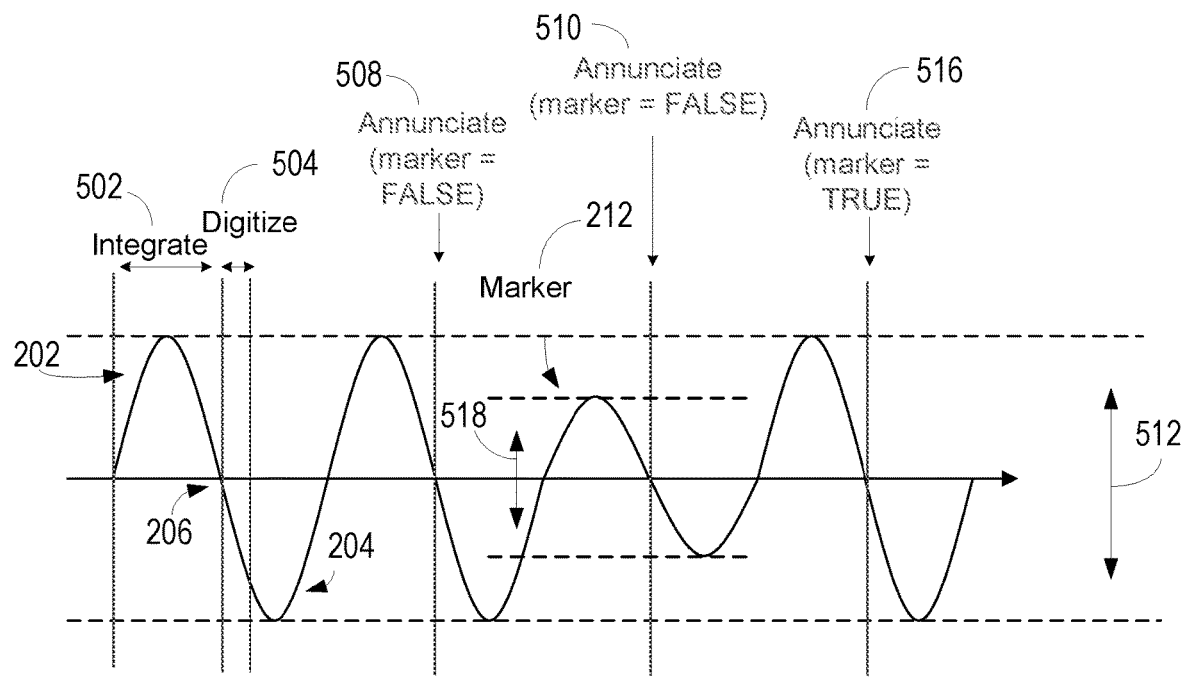
FIG. 5 is an example of an input signal waveform similar to FIG. 3 illustrating the activities of an integrator and the timer trigger included in the system.

FIG. 5 is an example of an input signal waveform similar to FIG. 3 illustrating the activities of the integrator 404 and the timer trigger 406. The integrator 404 and the timer trigger 406 are dynamically controlled by the controller during each variable period. Similar to FIG. 3, the input signal waveform is formed by a series of variable periods with variable magnitudes and includes the marker 212. Referring to FIGS. 4 and 5, the controller controls the integrator 404 to integrate over the first half cycle 202 of each of the variable periods during an integrate phase 502, or first phase, of the variable period. The first half cycle 202 may also be referred to as the positive amplitude of the input waveform. Following zero crossing of the input signal, as indicated by the zero crossing generator, the controller may control the integrator to discharge the magnitude of voltage to a predetermined voltage magnitude during a digitize phase 504, or second phase, of the variable period in which the discharge time to reach the predetermined voltage magnitude (V1) is captured. Since the discharge time to reach the fixed predetermined voltage (V1) is proportional to the magnitude of the voltage generated during the integration of phase 1, the controller may use the discharge time, or time ramp, to determine a magnitude of the voltage during each half cycle.

During the digitize period 504 the controller may compare a time ramp value of the iteratively averaged magnitude of a half cycle of a current variable period of the input signal to a time ramp value of the iteratively averaged magnitude of a second identified half cycle of a preceding variable period of the input signal to identify the difference between the magnitude of the identified half cycle of the current variable period of the analog input signal and the magnitude of the identified half cycle of the preceding variable period of the analog input signal. The difference may be compared by the controller to a predetermined range to determine if the marker 212 has been detected—in other words, that a short tooth has been detected. The predetermined range may be stored in memory such that the predetermined range may be adjusted to account for differences in magnitude of the peak-to-peak amplitude of the periods due to different frequency ranges, noise conditions, input signal period magnitudes and the like.

The controller may output the output signal (annunciate signal) on the communication line a predetermined time after completing the comparison to annunciate identification of the marker. The phase delay in annunciating whether the marker 212 has been detected (marker=True) or has not been detected (marker=False) may be maintained substantially constant so that the marker detection may be used to align the angular position of the rotating object, such as phonic wheel on a shaft, with other data, such as time-domain vibration data collected by the monitoring system.

In the example of FIG. 5, a first annunciation signal 508 and a second annunciation signal 510 output by the controller on the communication line may indicate marker=false since a difference in the ramp time values of two variable periods in the sequence of variable periods was less than or equal to a predetermined threshold difference. This is because a peak-to-peak voltage amplitude 512 of the input signal for the two variable periods is substantially the same by being within the predetermined threshold difference. A third annunciation signal 516 output by the controller may indicate marker=True due to a difference in the ramp time value of the marker 212 and the ramp time value of the preceding variable time period being outside the predetermined difference threshold. This is because a peak-to-peak voltage amplitude 518 of the marker 212 is significantly less than the peak-to-peak voltage amplitude 512 of the preceding variable period due to the ramp time of the marker 212 being significantly shorter than a ramp time of the preceding variable period. In other examples, comparison and annunciation of differences in the ramp times between the marker 212 and a subsequent variable period may be performed.

In an example the controller may compare a current ramp time value, such as a voltage ramp-down count to the previous period's ramp time value, such as a voltage ramp-down count. If the current ramp time value is lower than the previous period's ramp time value by a predetermined percentage, the controller may set, or output, the marker detection indication (e.g. third annunciation signal 516) during the subsequently following positive to negative transition of the input waveform as illustrated in FIG. 5. In this example, output of the indication by the controller may be delayed by one period to ensure the phase delay of the marker indication is not affected by the time it takes to digitize and compare the two counts, which can vary as a percentage of the input signal period depending on amplitude and frequency. In other examples, other periods of delay be used.

Referring to FIGS. 1-4, the controller 118 may include functionality to operate as a de-bounce filter to avoid receiving false indications from the zero crossing generator 304 of zero crossings of the input signal 106 due to noise in the system. In an example, operation of the de-bounce filter by the controller 118 may be dynamically set to a predetermined portion of the variable period 208 of the input waveform of the input signal 106, such as to a quarter of the variable period 208. The predetermined portion of the variable period 208 of the waveform may be determined based on, for example, an average period of pulses in the zero crossing signal pulse train, an external rotational speed signal provided from a reliable source, such as a speed sensor with filtering that is sensing rotational speed corresponding to the rotation of the rotating object 104, or any other mechanism that can identify a predetermined portion of the period of the waveform. Thus, the controller 118 may disregard the zero crossing signal 122 for a portion of the variable period 208 in response to receipt of a zero crossing signal 122 indicative of the zero crossing of the analog input signal 106. In example implementations of the debounce filter, heavier filtering and noise hardening techniques may be employed by the controller 118 with regard to the de-bounce filter without affecting the phase delay of the annunciation of the marker status.

The controller 118 may also control the programmable attenuator 302 via the magnitude control line 132 based on ramp time values. Since the ramp-time value is proportional to the integrator output 424, the controller 118 may use the ramp time value of a variable period 208 to adjust the programmable attenuator 302 in order to maintain the processed input signal 126 provided to the ADC circuitry 116 as an input signal within a predetermined peak-to-peak voltage boundary. This gives the maker detection function a wide dynamic range without requiring software intervention.

The programmable attenuator 302 may include hysteresis around the different predetermined attenuation circuits so that changing the attenuation setting from one attenuation circuit to another attenuation circuit does not cause a false maker annunciation (such as in the case of going from a lower attenuation to a higher attenuation). The hysteresis provided by the controller 118 may be in the form of a blanking function. The blanking function may be controlled by the controller 118 to block output of the output signal (annunciate signal) on the communication line 110. The controller 118 may blank (or block output) of the annunciate signal on the communication line 110 for a predetermined number of half cycles of the input signal 106 after the programmable controller 302 is switched to a different one of the attenuation circuits. Since the blanking functionality is controlled by the controller 118, no additional analog circuitry is needed. In alternative examples, the blanking functionality may be performed external to the controller using circuitry.

Table 1 is a state table illustrating an example of operation of the switches (SW1, SW2, SW3) in the integrator 402 by the controller. In this example,

TABLE 1

| State | sw1 | sw2 | sw3 | valid |
|---|---|---|---|---|
| Phase 1 - valid | closed | open | open | 0 |
| Phase 1 - invalid | closed | open | open | 1 |
| Phase 2 - valid | open | closed | open | 0 |
| Phase 2 - invalid | open | closed | open | 1 |
| Phase 3 | open | open | closed | 0 |

Figure 6:
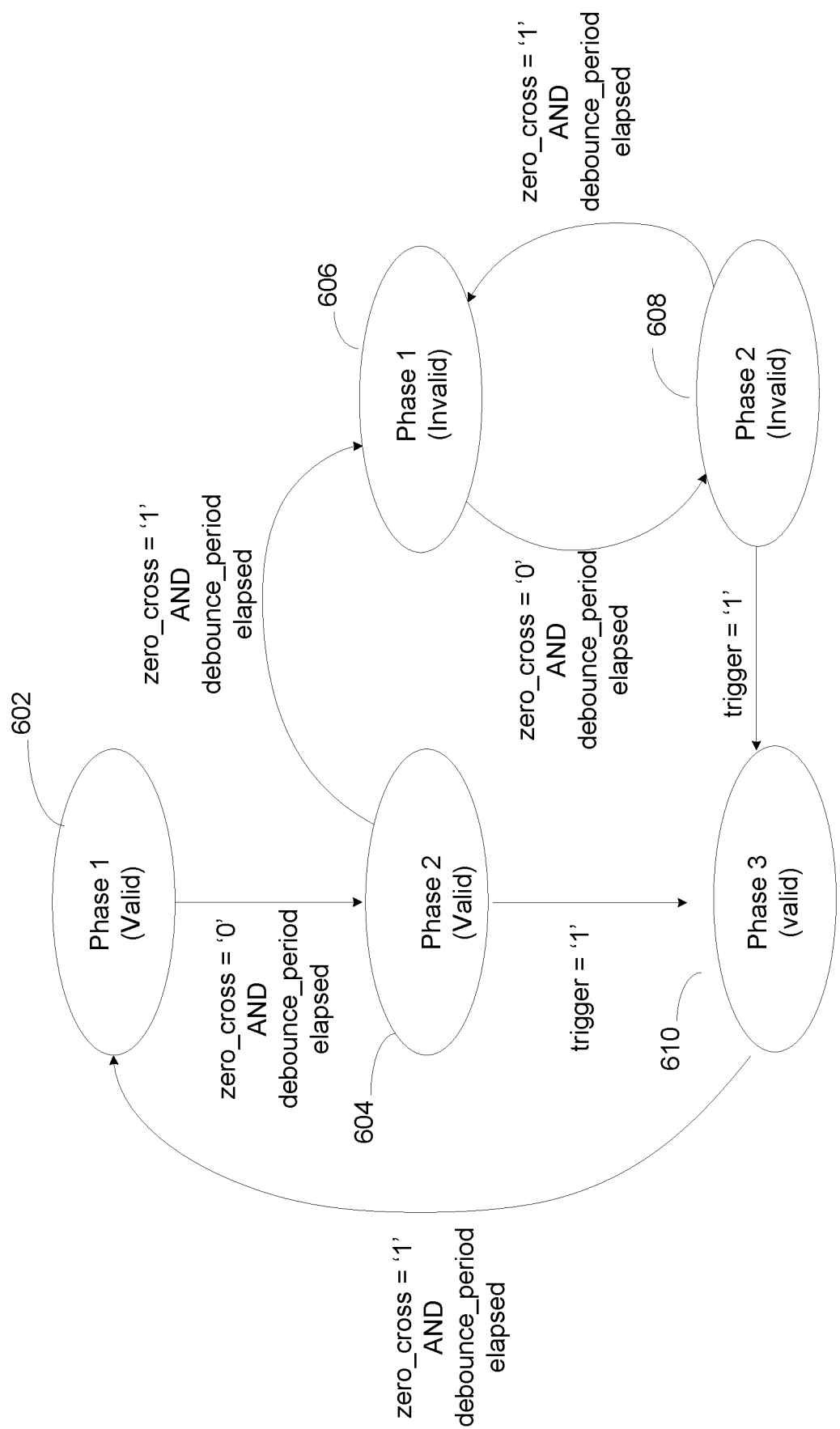
FIG. 6 is a flow diagram illustrating an example of three phases of operation of an integrator included in the position sensing system.

FIG. 6 is a flow diagram illustrating an example of three phases of operation of the integrator 404. With reference to Table 1, the flow of the operation starts with Phase 1 (valid) 602 which is in a valid state with switch (SW1) closed and switches (SW2 and SW3) open as illustrated in the first row of Table 1. The controller proceeds the operation to phase 2 604 when a zero crossing is detected and a zero cross signal is provided by the zero crossing generator to the controller. During phase 2 604 (valid), switches (SW1 and SW3) are open and switch 2 is open during the digitizing stage. In this example, in phase 1 (valid), the integrate step is occurring and the debounce period has elapsed such that the controller is no longer ignoring the zero crossing signal.

The controller may take the system to a phase 1 invalid 606 operation in response to the integrator 404 still being in the digitizing stage of phase 2 when a zero crossing signal indicating the input signal has entered the next variable period is received by the controller. The phase 1 invalid 606 condition may occur, for example, when the magnitude of the integrated voltage signal from the first half cycle is still ramping to reach the predetermined threshold, such as zero volts and the input signal enters a new variable period. In the phase 1 invalid 606 condition, (SW1) may be closed and switches (SW2 and SW3) may be open as indicated in row 2 of Table 1. The phase 1 invalid 606 may occur when the frequency of the input signal is too high for the system, such that the input signal is too fast for the system to handle.

The controller may take the system from phase 1 (invalid) to phase 2 (invalid) when, for example, the system is already indicating phase 1 is invalid. In another example, the controller may take the system from phase 1 (invalid) to phase 2 (invalid) when the integrator 404 has not been reset.

The controller may take the system from phase 2 (valid) 604 or phase 2 (invalid) 608 to phase 3 (valid) when the output of the timer trigger is received by the controller, thereby indicating that the integrated output voltage of the integrator has reached the predetermined threshold, such as zero volts, and the ramp time has been captured.

Figure 7:
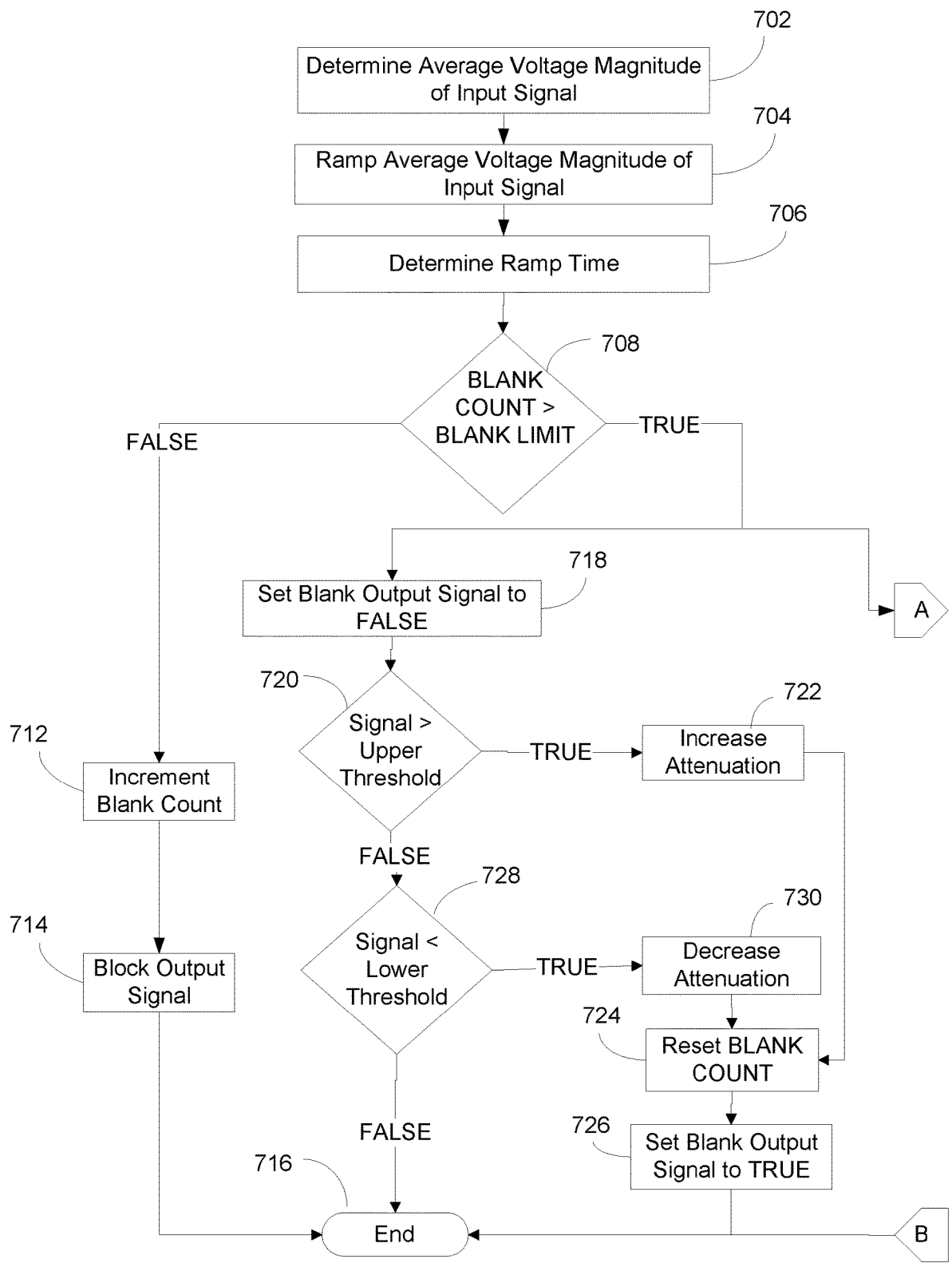
FIG. 7 is an operational flow diagram illustrating example operation of the position sensing system.

FIG. 7 is an operational flow diagram illustrating example operation of the position sensing system. In FIG. 7, processing by the position sensing system of a waveform is described, which illustrates iterative processing of a series of waveforms having variable magnitude and a variable period that form an input signal received by the position sensing system.

With reference to FIGS. 1-6, the controller 118 may control the ADC circuitry 116 to iteratively determine an average voltage magnitude of a half cycle of the variable magnitude input signal 106 during a variable period. (702) In an example, the average voltage magnitude may be determined by integration of the input signal during a positive half cycle of the variable period. The controller 118 may control the ADC circuitry 116 to ramp the average voltage magnitude of the input signal to a predetermined voltage. (704) In an example, the average voltage magnitude may be ramped down at a predetermined rate to a predetermined voltage level, such as zero volts, by being discharged through a predetermined resistance coupled to a voltage source having a voltage magnitude, such as a negative voltage, which is lower than the average voltage magnitude.

The controller 118 may determine a ramp time of the average voltage magnitude to reach the predetermined magnitude of voltage. (706) In an example, the controller 118 may establish a count or time value proportional to the average voltage magnitude. The controller 118 may determine if a blank count is greater than a predetermined blank limit. (708) The blank count may represent a period of time measured by the controller 118 since the programmable attenuator was directed to adjust an attenuation level of the input signal received by the ADC circuitry 116, and the blank limit may be a value representative of a predetermined period of time.

If the blank count is less than the blank limit, the controller 118 may increment the blank count (712), block output of an output signal (714), such as an annunciate signal, to a monitoring system 108, and end processing of the waveform (716). If the blank count is greater than the blank limit, the controller 118 may set a blank output signal to false (718), and determine if the peak-to-peak voltage magnitude of a half cycle of the input signal 106 is greater than a predetermined upper threshold. (720) If the peak-to-peak voltage magnitude of the half cycle of the input signal 106 is greater than the predetermined upper threshold, the controller 118 may direct the programmable attenuator to increase the attenuation of the input signal (722), reset the blank count (724), set the blank output signal to true (726) and end. (716)

If the peak-to-peak voltage magnitude of the half cycle of the input signal 106 is less than the predetermined upper threshold, the controller 118 may determine if the peak-to-peak voltage magnitude of a half cycle of the input signal 106 is less than a predetermined lower threshold. (728) If the peak-to-peak voltage magnitude of the half cycle of the input signal 106 is not less than the predetermined lower threshold, the processing ends. (716) If the peak-to-peak voltage magnitude of the half cycle of the input signal 106 is less than the predetermined lower threshold, the controller 118 may direct the programmable attenuator 302 to switch to increase the level of attenuation of the input signal (730), reset the blank count (724), set the blank output signal to true (726) and end. (716)

Figure 8:
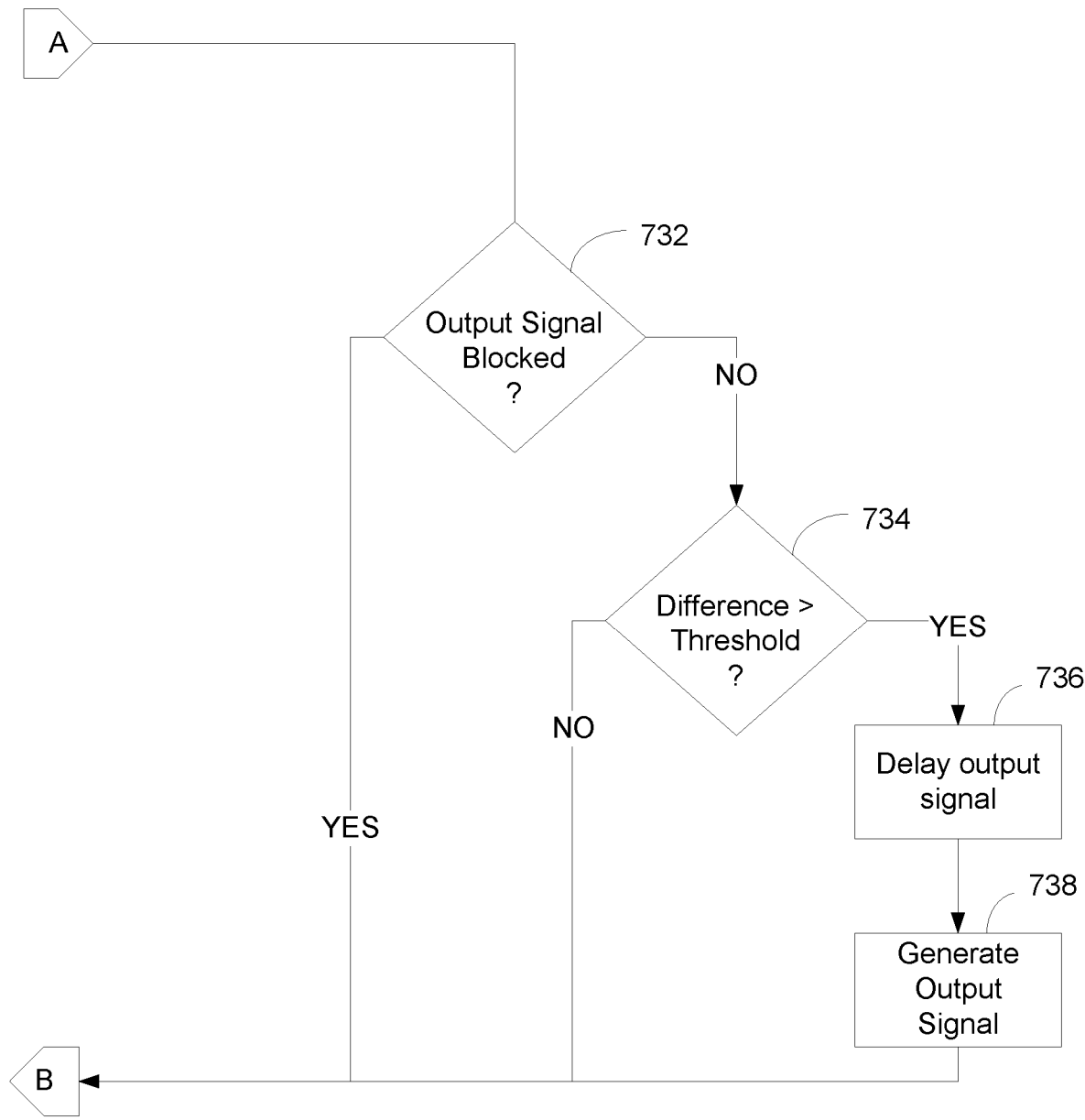
FIG. 8 is a second page of the operational flow diagram of FIG. 7.

Referring to FIG. 8, if the blank count is greater than the blank limit, the controller 118 may also determine if the output signal (annunciate signal) is block. (732) If the output signal is blocked due to the blank output signal not yet being set to false, the processing of the waveform ends. (716) If the output signal is not blocked, the controller 118 may compare the ramp time of the current waveform to the ramp time of the previous waveform in the sequence and determine if the difference is outside a predetermined range. (734) If not, the processing of the waveform ends. (716) If the difference between the ramp time of the current waveform and the ramp time of the previous waveform in the sequence is outside the predetermined range, the controller 118 may delay outputting the output signal (annunciate signal) for a predetermined time (736), and then generate the output signal (738).

Each component may include additional, different, or fewer components. For example, the controller 118 may be multiple controllers, or the sensor 102 may be multiple sensors, or the monitoring system 108 may be multiple monitoring systems. In addition, the system 100 may be implemented with additional, different, or fewer components. For example, portions of the analog conditioning circuitry 114 may be omitted. The logic illustrated in the flow diagrams may include additional, different, or fewer operations than illustrated. The operations illustrated may be performed in an order different than illustrated.

The methods, devices, processing, circuitry, and logic described above may be implemented in many different ways and in many different combinations of hardware and software. For example, all or parts of the implementations may be circuitry that includes an instruction processor, such as a Central Processing Unit (CPU), microcontroller, or a microprocessor; or as an Application Specific Integrated Circuit (ASIC), Programmable Logic Device (PLD), or Field Programmable Gate Array (FPGA); or as circuitry that includes discrete logic or other circuit components, including analog circuit components, digital circuit components or both; or any combination thereof. The circuitry may include discrete interconnected hardware components or may be combined on a single integrated circuit die, distributed among multiple integrated circuit dies, or implemented in a Multiple Chip Module (MCM) of multiple integrated circuit dies in a common package, as examples.

Accordingly, the circuitry may store or access instructions for execution, or may implement its functionality in hardware alone. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed. For instance, the circuitry may include multiple distinct system components, such as multiple processors and memories, and may span multiple distributed processing systems. Parameters, databases, and other data structures may be separately stored and managed, may be incorporated into a single memory or database, may be logically and physically organized in many different ways, and may be implemented in many different ways. Example implementations include linked lists, program variables, hash tables, arrays, records (e.g., database records), objects, and implicit storage mechanisms. Instructions may form parts (e.g., subroutines or other code sections) of a single program, may form multiple separate programs, may be distributed across multiple memories and processors, and may be implemented in many different ways. Example implementations include stand-alone programs, and as part of a library, such as a shared library like a Dynamic Link Library (DLL). The library, for example, may contain shared data and one or more shared programs that include instructions that perform any of the processing described above or illustrated in the drawings, when executed by the circuitry.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. In addition, the use of the article "a" in the claims is equivalent to "one or more."

While various embodiments have been described, it will be apparent to those of ordinary skill in the art that many more embodiments and implementations are possible. Accordingly, the embodiments described herein are examples, not the only possible embodiments and implementations.

The subject-matter of the disclosure may also relate, among others, to the following aspects:

1. A position sensing system for a rotating object comprising:
   analog conditioning circuitry configured to identify a half cycle of an analog input signal having a variable period and a variable magnitude, the analog input signal received from a sensor;
   analog to digital converter circuitry configured to process the analog input signal during the variable period; and
   a controller configured to control the analog to digital converter circuitry to compare a magnitude of the identified half cycle of a first variable period of the analog input signal to a magnitude of the identified half cycle of a second variable period of the analog input signal;
   the controller further configured to generate an output signal when a difference between the magnitude of the identified half cycle of the first variable period of the analog input signal and the magnitude of the identified half cycle of the second variable period of the analog input signal is greater than a predetermined threshold.

2. The position sensing system of aspect 1, wherein the controller is configured to control the analog to digital converter system to iteratively average a magnitude of the analog input signal during identified half cycles of the analog input signal; and
   the controller is further configured to compare a time ramp of the iteratively averaged magnitude of the first identified half cycle of the first variable period of the analog input signal to a time ramp of the iteratively averaged magnitude of the second identified half cycle of the second variable period of the analog input signal to identify the difference between the magnitude of the identified half cycle of the first variable period of the analog input signal and the magnitude of the identified half cycle of the second variable period of the analog input signal.

3. The position sensing system as in aspect 1 or 2, wherein the analog conditioning circuit includes a programmable attenuator configured with a plurality of predetermined attenuation circuits, and the controller is configured to select one of the predetermined attenuation circuits based on an amplitude of at least one of the magnitude of the identified half cycle of the first variable period of the analog input signal or the magnitude of the identified half cycle of the second variable period of the analog input signal.

4. The position sensing system of aspect 3, wherein the selected one of the predetermined attenuation circuits is configured to attenuate at least one of the magnitude of the identified half cycle of the first variable period of the analog input signal or the magnitude of the identified half cycle of the second variable period of the analog input signal.

5. The position sensing system of aspect 3, wherein the controller is configured to block output of the output signal for a predetermined number of half cycles identified by the analog conditioning circuit in response to selection of a different one of the predetermined attenuation circuits.

6. The position sensing system as in any of aspect 1-5, wherein the analog conditioning circuit is configured to generate a zero crossing signal indicative of a zero crossing of the analog input signal to the controller to identify the half cycle of the analog input signal.

7. The position sensing system of aspect 6, wherein the controller is further configured to disregard the zero crossing signal for a portion of the variable period in response to receipt of the zero crossing signal indicative of the zero crossing of the analog input signal.

8. The position sensing system of aspect 7, wherein the portion of the variable period occurs twice per cycle for about a quarter of the variable period, and the processor is configured to determine the variable period based on receipt of a rotational speed signal from an external speed sensor.

9. A method comprising:
receiving a series of variable magnitude and variable period input signal pulses formed as an analog input signal;
averaging a voltage of a first input signal pulse over a half cycle of a first variable period;
timing a ramp time of a magnitude of the voltage of the first input signal pulse to a predetermined voltage magnitude to obtain a first ramp time;
averaging a voltage of a second input signal pulse over a half cycle of a second variable period;
timing a ramp time of a magnitude of the voltage of the second input signal pulse to the predetermined voltage magnitude to obtain a second ramp time;
comparing the first ramp time and the second ramp time; and
triggering an output pulse when a difference between the first ramp time and the second ramp time is outside a predetermined range.

10. The method of aspect 9, comprises an initial step of generating with a variable reluctance sensor the analog input signal to represent a plurality of teeth included on a rotating object; and the step of triggering the output pulse when the difference between the first ramp time and the second ramp time is outside the predetermined range comprises indicating with the output pulse that a first tooth within the plurality of teeth is shorter than a second tooth included in the plurality of teeth.

11. The method of aspect 10, wherein the step of triggering the output pulse when the difference between the first ramp time and the second ramp time is outside the predetermined range comprises delaying the triggering until a half cycle of a third variable period that sequentially follows the second variable period.

12. The method as in any of aspects 9-11, wherein the step of timing the ramp time of the magnitude of the voltage of the first input signal pulse comprises timing the ramp time of the magnitude of the voltage of the first input signal pulse during an other half cycle of the first variable period, and timing the ramp time of the magnitude of the voltage of the second input signal pulse comprises timing the ramp time of the magnitude of the voltage of the second input signal pulse during an other half cycle of the second variable period.

13. The method of aspect 12, wherein the step of comparing the first ramp time and the second ramp time comprises the step of comparing the first ramp time and the second ramp time during the other half cycle of the of the second variable period.

14. The method as in any of aspects 9-13, wherein the step of averaging the voltage of the first input signal pulse comprises integrating the voltage of the first input signal pulse during an entirety of the half cycle of the first variable period, and the step of averaging the voltage of the second input signal pulse comprises integrating the voltage of the second input signal pulse during an entirety of the half cycle of the second variable period.

15. The method as in any of aspects 9-14, further comprising:
monitoring the magnitude of the voltage of the first input signal pulse and the magnitude of the voltage of the second input signal pulse; and
adjusting a gain of the series of variable magnitude and variable period input signal pulses to maintain the variable magnitude within a predetermined range.

16. The method as in any of aspects 9-15, further comprising detecting zero voltage crossings of the variable magnitude and variable period input signal pulses; and ignoring an indication of detection of a next zero voltage crossing that occurs within a predetermined time of detection of a previous zero voltage crossing.

17. A position sensing system for a rotating object comprising:
circuitry operable to receive and condition a series of variable magnitude and variable period input signal pulses;
circuitry operable to determine a voltage magnitude during a first half cycle of each of the series of variable magnitude and variable period input signal pulses;
circuitry operable to compare the voltage magnitude of an input signal pulse in the series to the voltage magnitude of another input signal pulse in the series; and
circuitry operable to generate an output signal in response to a difference between the voltage magnitude of the input signal pulse and the voltage magnitude of the another input signal pulse being outside a predetermined range.

18. The position sensing system of aspect 17, wherein the circuitry operable to determine the voltage magnitude during a first half cycle of each of the series of variable magnitude and variable period input signal pulses further comprises circuitry operable to integrate the variable magnitude and variable period input signal pulses to determine an average of the voltage magnitude during the first half cycle of each of the series of variable magnitude and variable period input signal pulses.

19. The position sensing system as in aspect 17 or 18, further comprising circuitry operable to attenuate the input signal pulses with one of a plurality of different attenuation circuits that are dynamically switched to apply to the input signal pulses based on changes in the voltage magnitude determined during the first half cycle.

20. The position sensing system as in any of aspects 17-19, wherein the variable magnitude and variable period input signal pulses are each representative of a respective height of one of a plurality of teeth mounted on a rotating object being sensed by a sensor, and a height of one of the plurality of teeth is less than a height of a remainder of the plurality of teeth mounted on the rotating object, and the output signal is generated in response to detection of the one of the plurality of teeth.

What is claimed is:

1. A position sensing system for a rotating object comprising:
    analog conditioning circuitry configured to identify a half cycle of an analog input signal having a variable period and a variable magnitude, the analog input signal received from a sensor, and wherein the analog conditioning circuit includes a programmable attenuator configured with a plurality of predetermined attenuation circuits;
    analog to digital converter circuitry configured to process the analog input signal during the variable period; and
    a controller configured to control the analog to digital converter circuitry to compare a magnitude of the identified half cycle of a first variable period of the analog input signal to a magnitude of the identified half cycle of a second variable period of the analog input signal, wherein the controller is further configured to select at least one of the predetermined attenuation circuits based on an amplitude of at least one of the magnitude of the identified half cycle of the first variable period of the analog input signal or the magnitude of the identified half cycle of the second variable period of the analog input signal;
    the controller further configured to generate an output signal when a difference between the magnitude of the identified half cycle of the first variable period of the analog input signal and the magnitude of the identified half cycle of the second variable period of the analog input signal is greater than a predetermined threshold.

2. The position sensing system of claim 1, wherein the controller is configured to control the analog to digital converter system to iteratively average a magnitude of the analog input signal during identified half cycles of the analog input signal; and
    the controller is further configured to compare a time ramp of the iteratively averaged magnitude of the first identified half cycle of the first variable period of the analog input signal to a time ramp of the iteratively averaged magnitude of the second identified half cycle of the second variable period of the analog input signal to identify the difference between the magnitude of the identified half cycle of the first variable period of the analog input signal and the magnitude of the identified half cycle of the second variable period of the analog input signal.

3. The position sensing system of claim 1, wherein the selected one of the predetermined attenuation circuits is configured to attenuate at least one of the magnitude of the identified half cycle of the first variable period of the analog input signal or the magnitude of the identified half cycle of the second variable period of the analog input signal.

4. The position sensing system of claim 1, wherein the controller is configured to block output of the output signal for a predetermined number of half cycles identified by the analog conditioning circuit in response to selection of a different one of the predetermined attenuation circuits.

5. The position sensing system of claim 1, wherein the analog conditioning circuit is configured to generate a zero crossing signal indicative of a zero crossing of the analog input signal to the controller to identify the half cycle of the analog input signal.

6. The position sensing system of claim 5, wherein the controller is further configured to disregard the zero crossing signal for a portion of the variable period in response to receipt of the zero crossing signal indicative of the zero crossing of the analog input signal.

7. The position sensing system of claim 6, wherein the portion of the variable period occurs twice per cycle for about a quarter of the variable period, and the processor is configured to determine the variable period based on receipt of a rotational speed signal from an external speed sensor.

8. A method comprising:
    receiving a series of variable magnitude and variable period input signal pulses formed as an analog input signal;
    averaging a voltage of a first input signal pulse over a half cycle of a first variable period;
    timing a ramp time of a magnitude of the voltage of the first input signal pulse to a predetermined voltage magnitude to obtain a first ramp time;
    averaging a voltage of a second input signal pulse over a half cycle of a second variable period;
    timing a ramp time of a magnitude of the voltage of the second input signal pulse to the predetermined voltage magnitude to obtain a second ramp time;
    comparing the first ramp time and the second ramp time; and
    triggering an output pulse when a difference between the first ramp time and the second ramp time is outside a predetermined range.

9. The method of claim 8, comprises an initial step of generating with a variable reluctance sensor the analog input signal to represent a plurality of teeth included on a rotating object; and the step of triggering the output pulse when the difference between the first ramp time and the second ramp time is outside the predetermined range comprises indicating with the output pulse that a first tooth within the plurality of teeth is shorter than a second tooth included in the plurality of teeth.

10. The method of claim 9, wherein the step of triggering the output pulse when the difference between the first ramp time and the second ramp time is outside the predetermined range comprises delaying the triggering until a half cycle of a third variable period that sequentially follows the second variable period.

11. The method of claim 8, wherein the step of timing the ramp time of the magnitude of the voltage of the first input signal pulse comprises timing the ramp time of the magnitude of the voltage of the first input signal pulse during an other half cycle of the first variable period, and timing the ramp time of the magnitude of the voltage of the second input signal pulse comprises timing the ramp time of the magnitude of the voltage of the second input signal pulse during an other half cycle of the second variable period.

12. The method of claim 11, wherein the step of comparing the first ramp time and the second ramp time comprises the step of comparing the first ramp time and the second ramp time during the other half cycle of the of the second variable period.

13. The method of claim 8, wherein the step of averaging the voltage of the first input signal pulse comprises integrating the voltage of the first input signal pulse during an entirety of the half cycle of the first variable period, and the step of averaging the voltage of the second input signal pulse comprises integrating the voltage of the second input signal pulse during an entirety of the half cycle of the second variable period.

14. The method of claim 8, further comprising:
monitoring the magnitude of the voltage of the first input signal pulse and the magnitude of the voltage of the second input signal pulse; and
adjusting a gain of the series of variable magnitude and variable period input signal pulses to maintain the variable magnitude within a predetermined range.

15. The method of claim 8, further comprising detecting zero voltage crossings of the variable magnitude and variable period input signal pulses; and ignoring an indication of detection of a next zero voltage crossing that occurs within a predetermined time of detection of a previous zero voltage crossing.

16. A position sensing system for a rotating object comprising:
circuitry operable to receive and condition a series of variable magnitude and variable period input signal pulses;
circuitry operable to determine a voltage magnitude during a first half cycle of each of the series of variable magnitude and variable period input signal pulses;
circuitry operable to compare the voltage magnitude of an input signal pulse in the series to the voltage magnitude of another input signal pulse in the series; and
circuitry operable to generate an output signal in response to a difference between the voltage magnitude of the input signal pulse and the voltage magnitude of the another input signal pulse being outside a predetermined range.

17. The position sensing system of claim 16, wherein the circuitry operable to determine the voltage magnitude during a first half cycle of each of the series of variable magnitude and variable period input signal pulses further comprises circuitry operable to integrate the variable magnitude and variable period input signal pulses to determine an average of the voltage magnitude during the first half cycle of each of the series of variable magnitude and variable period input signal pulses.

18. The position sensing system of claim 16, further comprising circuitry operable to attenuate the input signal pulses with one of a plurality of different attenuation circuits that are dynamically switched to apply to the input signal pulses based on changes in the voltage magnitude determined during the first half cycle.

19. The position sensing system of claim 16, wherein the variable magnitude and variable period input signal pulses are each representative of a respective height of one of a plurality of teeth mounted on a rotating object being sensed by a sensor, and a height of one of the plurality of teeth is less than a height of a remainder of the plurality of teeth mounted on the rotating object, and the output signal is generated in response to detection of the one of the plurality of teeth.

* * * * *